United States Patent
Mun et al.

(10) Patent No.: US 7,435,301 B2
(45) Date of Patent: Oct. 14, 2008

(54) CLEANING SOLUTION OF SILICON GERMANIUM LAYER AND CLEANING METHOD USING THE SAME

(75) Inventors: Chang-Sup Mun, Incheon-si (KR); Doo-Won Kwon, Seoul (KR); Hyung-Ho Ko, Seoul (KR); Chang-Ki Hong, Seongnam-si (KR); Sang-Jun Choi, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 449 days.

(21) Appl. No.: 11/104,829

(22) Filed: Apr. 13, 2005

(65) Prior Publication Data

US 2005/0239672 A1 Oct. 27, 2005

(30) Foreign Application Priority Data

Apr. 14, 2004 (KR) .................. 10-2004-0025651

(51) Int. Cl.
  *C23G 1/16* (2006.01)
(52) U.S. Cl. .................. 134/2; 134/1; 134/22.13; 134/22.14; 134/22.17; 134/22.19; 134/25.4; 134/29; 134/34; 134/36; 134/42; 134/902; 510/175; 510/401; 510/421; 510/435; 510/506
(58) Field of Classification Search .......... 134/1, 134/2, 22.1, 22.13, 22.14, 22.17, 22.19, 25.4, 134/29, 34, 36, 42, 902; 510/175, 421, 435, 510/506, 401
See application file for complete search history.

(56) References Cited

U.S. PATENT DOCUMENTS

| 4,339,340 | A  | * | 7/1982  | Muraoka et al. ........... 252/79.5 |
| 2001/0025017 | A1 | * | 9/2001 | Amemiya et al. .......... 510/175 |
| 2001/0037821 | A1 | * | 11/2001 | Staley et al. ............ 134/25.4 |
| 2004/0050406 | A1 | * | 3/2004 | Sehgal .................. 134/26 |
| 2005/0040442 | A1 | * | 2/2005 | Andreas et al. ........... 257/253 |
| 2005/0090109 | A1 | * | 4/2005 | Carter et al. ............ 438/692 |

FOREIGN PATENT DOCUMENTS

| JP | 11-135792 | 5/1999 |
| JP | 2000-319699 | 11/2000 |
| JP | 2002-299641 | 10/2002 |
| JP | 2003-086554 | 3/2003 |

* cited by examiner

*Primary Examiner*—Sharidan Carrillo
(74) *Attorney, Agent, or Firm*—F. Chau & Associates, LLC

(57) ABSTRACT

Disclosed are a cleaning solution for preventing damage of a silicon germanium layer when cleaning a semiconductor device including the silicon germanium layer and a cleaning method using the same. The cleaning solution of a silicon germanium layer includes from about 0.01 to about 2.5 percent by weight of a non-ionic surfactant with respect to 100 percent by weight of the cleaning solution, about 0.05 to about 5.0 percent by weight of an alkaline compound with respect to the cleaning solution and a remaining amount of pure water. The damage to an exposed silicon germanium layer can be prevented when cleaning a silicon substrate having a silicon germanium layer. Impurities present on the surface portion of the silicon germanium layer can be effectively removed.

6 Claims, 12 Drawing Sheets

CLEANING SOLUTION OF SILICON GERMANIUM LAYER AND CLEANING METHOD USING THE SAME

CROSS-REFERENCE TO RELATED APPLICATION

This application claims priority under 35 USC § 119 to Korean Patent Application No. 2004-25651 filed on Apr. 14, 2004, the content of which is incorporated herein by reference.

BACKGROUND OF THE INVENTION

1. Field of the Invention

The present invention relates to a cleaning solution for cleaning resist patterns of a semiconductor device and a cleaning method using the same. More particularly, the present invention relates to a cleaning solution for cleaning impurities in the surface portion of the silicon germanium (SiGe) layer of a semiconductor device and a cleaning method using the same.

2. Description of the Related Arts

The trend in the art requires integration of semiconductor devices with lower power consumption in order to process a greater amount of information faster. Therefore, the art requires that the size of the semiconductor devices be lowered to 100 nm or less, thereby reducing the space for forming patterns.

In particular, the development of transistors in CMOS devices requires fine gate structure and thin film gate. Also, the development of highly integrated devices and the operation thereof requires low power consumption. Technical improvement is necessary and the cost investment thereof increases commensurate with the small size of the transistors.

Therefore, to develop a MOS-type transistor that requires low power, a method of improving the driving power independent of the transistor's small size has been suggested. This method includes a layer of silicon germanium between the silicon substrate and the silicon layer.

According to the above-mentioned method, a silicon germanium layer is formed on the silicon substrate and then a strained silicon layer with tensile transformation is formed. The strained silicon layer is used as a transistor channel to improve the driving power of the transistor. That is, as disclosed in a literature (IEDM Tech. Digest, 1994, p 373-376), the strained layer in which tensile transformation may occur and positioned on the silicon germanium layer, exhibits an improved migration because the practical effective mass of electrons converts to light when compared with that of the general silicon substrate. The transistor having this property exhibits an improved transistor driving power.

In addition, as the size of the semiconductor device decreases, the increased electron mobility and the shield of leakage current that leaks to the lower portion of the substrate from the source/drain region of the semiconductor devices are very important considerations for driving the highly integrated semiconductor devices.

When the leakage current that leaks from the source/drain region is formed on the semiconductor substrate to the lower portion of the substrate, the total amount of the leakage current from the semiconductor devices is fairly large, thereby lowering the driving velocity of the semiconductor devices. Accordingly, there is an ongoing effort to use the buried insulation layer of the silicon germanium layer formed on the semiconductor device to prevent the leakage current from flowing to the lower portion of the substrate.

The buried insulation layer that corresponds to the silicon germanium layer is positioned under the lower portion of the active region of the substrate, and prevents the migration of the electrons to the lower portion when a channel is formed in the semiconductor device and the electrons migrate at the source/drain region. The substrate, including silicon germanium, is obtained by forming a silicon germanium layer on the silicon substrate and growing silicon on the silicon germanium layer.

The silicon germanium layer that is formed is selectively present at the active region of the semiconductor substrate by an isolation process on the semiconductor substrate. To form a semiconductor device that includes the silicon germanium layer requires a cleaning process for removing impurities or particles generated during the evaporation process of the silicon germanium layer and the etching process. Here, the cleaning process is preferably carried out by using a cleaning solution having a high etching selectivity with respect to the silicon germanium layer to remove the impurities.

Generally, standard cleaning 1 (SC-1) cleaning solution is most widely used. By wet etching using SC-1, the etching selectivity onto silicon germanium with respect to silicon can be advantageously controlled according to the temperature and time applied. However, the surface portion of the silicon germanium layer is rapidly oxidized due to hydrogen peroxide ($H_2O_2$) or hydrogen fluoride (HF) in the SC-1. Because of the oxidation of the silicon germanium layer, silicon germanium is etched faster than the common silicon layer.

Therefore, the SC-1 cleaning solution should not be used for the cleaning process of removing particles present at the exposed substrate of the silicon germanium layer. In addition, certain other cleaning solutions for cleaning semiconductor substrate, including hydrogen fluoride and nitric acid, should also not be used because they oxidize and over-etch the silicon germanium layer.

Japanese Laid-Open Patent Publication No. Hei 15-086554 discloses a manufacturing apparatus for a semiconductor substrate and a method of manufacturing a semiconductor substrate by which a chemical cleaning method ensures the removal of impurities from the surface of a silicon germanium layer. The apparatus includes a first cleaning bath containing a first pure water, a second cleaning bath containing hydrogen fluoride, and a third cleaning bath containing a second pure water. The substrate having a silicon germanium layer as a surface layer, is subsequently cleaned through the first, second and third cleaning baths using water or hydrogen fluoride. Small particles in the air and a natural oxide layer present at the silicon germanium layer can be effectively removed. However, the surface portion of the silicon germanium layer may be damaged even though the native oxide layer present at the surface of the silicon germanium layer is effectively removed.

As described above, various methods for treating a semiconductor substrate including silicon germanium are used. However, when a cleaning solution containing hydrogen fluoride, hydrogen peroxide or nitric acid is used for cleaning a semiconductor substrate in which the silicon germanium layer is exposed, the surface portion of the exposed silicon germanium layer that is exposed to the cleaning solution may damage and the shape of the surface portion thereof may deform. That is, a cleaning solution for silicon germanium and a method of cleaning thereof overcoming the above-described method may be required.

SUMMARY OF THE INVENTION

The present invention provides a cleaning solution for cleaning a silicon germanium layer that reduces damage to silicon germanium, removes impurities and improves rough surfaces.

The present invention also provides an effective method for cleaning a semiconductor device, including the silicon germanium layer and the metal pattern.

In accordance with one embodiment of the present invention, a cleaning solution of a silicon germanium layer includes from about 0.01 to about 2.5 percent by weight of a non-ionic surfactant, from about 0.05 to about 5.0 percent by weight of an alkaline, and a remaining amount of pure water with respect to 100 percent by weight of the cleaning solution.

In accordance with another embodiment of the present invention, a cleaning solution of a silicon germanium layer includes from about 0.01 to about 2.5 percent by weight, from about 0.05 to about 5.0 percent by weight of an alkaline compound, from about 0.01 to about 2.5 percent by weight of a metal corrosion inhibitor, and a remaining amount of a pure water with respect to 100 percent by weight of the cleaning solution.

In a cleaning method in accordance with one embodiment of the present invention, a cleaning solution of silicon germanium, including from about 0.01 to about 2.5 percent by weight of a non-ionic surfactant, from about 0.05 to about 5.0 percent by weight of an alkaline compound, from about 92.5 to about 99.93 percent by weight of pure water with respect to 100 percent by weight of the cleaning solution, is prepared. Then, a silicon germanium layer exposed by a trench is cleaned using the cleaning solution.

In a cleaning method in accordance with another embodiment of the present invention, a cleaning solution of silicon germanium including from about 0.01 to about 2.5 percent by weight of a non-ionic surfactant, from about 0.05 to about 5.0 percent by weight of an alkaline compound, from about 0.01 to about 2.5 percent by weight of a metal corrosion inhibitor, and from about 90 to about 99.9 percent by weight of pure water with respect to 100 percents by weight of the cleaning solution, is prepared. Then, a Metal-Insulator-poly Silicon (MIS) capacitor in which its upper electrode includes a silicon germanium layer is cleaned using the cleaning solution, while preventing damage to the silicon germanium layer and removing impurities present at the surface portion of the silicon germanium layer.

According to an embodiment of the present invention, the cleaning solution can improve the rough surface without damaging the surface of a silicon germanium layer formed thereon, and remove impurities present on the surface portion thereof. In addition, the cleaning solution may also prevent corrosion of the metal pattern and over-etching of the silicon germanium layer during the cleaning process of the semiconductor device in which metal patterns and silicon germanium layer are exposed.

By using the cleaning solution of the present invention, a highly reliable semiconductor device can be manufactured to save time and cost which would otherwise be required for the manufacturing of the entire semiconductor device. Further, comparable power may be achieved by using the semiconductor devices that have undergone treatment using the method of the present invention.

BRIEF DESCRIPTION OF THE DRAWINGS

The present invention will become more apparent by describing the preferred embodiments in detail with reference to the attached drawings in which.

DESCRIPTION OF THE PREFERRED EMBODIMENTS

Figure 1:
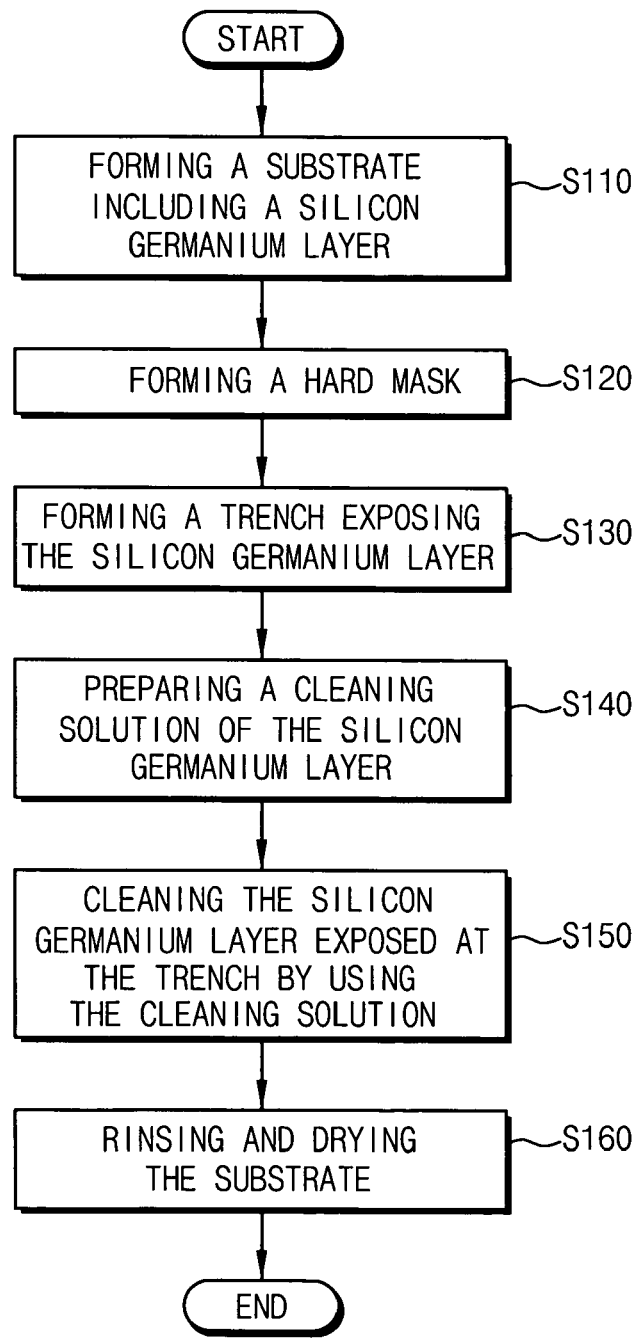
FIG. 1 is a flow chart showing a cleaning method of a semiconductor substrate from which a silicon germanium pattern is exposed according to a preferred embodiment of the present invention.

The present invention will now be described more fully hereinafter with reference to the accompanying drawings, in which embodiments of the invention are shown. The present invention may, however, be embodied in many different forms and should not be construed as limited to the embodiments set forth herein; rather, these embodiments are provided so that this disclosure will be thorough and complete, and will fully convey the scope of the invention to those skilled in the art. It will be understood that when an element such as a layer, a region or a substrate is referred to as being "on" or "onto" another element, it can be directly on the other element or intervening elements may also be present.

In accordance with one embodiment of the present invention, the cleaning solution for cleaning the silicon germanium layer effectively prevents damage of the silicon germanium layer exposed from a semiconductor substrate and improves the surface state of the silicon germanium layer having impurities and rough surface (germanium oxide).

The cleaning solution of the silicon germanium layer includes a non-ionic surfactant, an alkaline compound and pure water.

The non-ionic surfactant is a low-foaming surfactant, which does not include a dissociating functional group when dissolved in water but includes a hydrophobic terminal functional group.

Here, examples of the non-ionic surfactant in the cleaning solution of the germanium layer include polyoxyethylene alkyl ether (NCW1002; trade name available from Wako Chemical Co. Ltd.), polyoxyethylene nonyl phenylether (NP), polyoxyethylene lauryl ether (LA), polyoxyethylene tridecyl ether (TDA), polyoxyethylene oleyl ether (OA), polyoxyethylene stearyl ether (SA) and polyoxyethylene lauryl amine (LM). These may be used alone or in a mixture with these or other non-ionic surfactants.

When an amount of the non-ionic surfactant is less than about 0.01 percent by weight with respect to 100 percent by weight of the cleaning solution of the silicon germanium layer, the amount of etching in the silicon germanium layer is large, causing damage to the silicon germanium layer and deterioration in the etching uniformity to give a rough surface portion.

When the amount of the non-ionic surfactant exceeds about 2.5 percent by weight, the etching amount of the silicon germanium layer is not increased but is converged to a constant etching amount. Therefore, the preferred amount of the non-ionic surfactant is in the range of from about 0.01 to about 2.5 percent by weight with respect to 100 percent by weight of the cleaning solution, and more preferably, the amount is in the range of from about 0.1 to about 1.0 percent by weight.

The cleaning solution of the silicon germanium layer includes an alkaline compound. Any alkaline compound can be used without exception. Particularly, for purposes of the present invention, an inorganic alkaline compound including potassium hydroxide (KOH) or ammonium hydroxide and an organic alkaline compound including tetramethyl ammonium hydroxide are examples of alkaline compounds. These can be used alone or in a mixture thereof.

Here, the alkaline compound improves the removing efficiency of the cleaning solution with respect to particles and germanium oxide formed from oxidation of the surface of silicon germanium. For example, after implementing a dry etching process or a chemical mechanical polishing (CMP), the germanium oxide formed through an oxidation of germanium in the silicon germanium layer can be effectively removed.

When the amount of the alkaline compound is less than about 0.05 percent by weight with respect to the cleaning solution, the cleaning efficiency for removing germanium oxide and impurities is lowered, and when the amount exceeds about 5.0 percent by weight, damages to the cleaning apparatus and the semiconductor device may occur. Therefore, the preferred amount of the alkaline compound is in the range of from about 0.05 to about 5.0 percent by weight with respect to the cleaning solution and more preferred amount is in the range of from about 0.15 to about 3.0 percent by weight.

The cleaning solution according to the present invention includes pure water. The pure water is the remaining component of the cleaning solution, except the surfactant and the alkaline compound. The cleaning solution of the silicon germanium layer can be prepared by mixing the surfactant, the alkaline compound and pure water and then stirring the resulting mixture. Thus, the resulting cleaning solution has a good cleaning effect for removing impurities and preventing damage to the silicon germanium layer. The surface of the silicon germanium layer having a rough surface due to germanium oxide can be improved to increase the reliability of the highly integrated semiconductor device.

Hereinafter, a cleaning method for cleaning a semiconductor device using a cleaning solution according to the above-described embodiment and a method of forming an isolation pattern using the cleaning solution will be described.

FIG. 1 is a flow chart for explaining a cleaning method for a semiconductor substrate from which a silicon germanium pattern is exposed according to a preferred embodiment of the present invention. FIGS. 2 to 6 are cross-sectional views for illustrating an embodiment of a method for forming isolation patterns, including the cleaning method of the present invention.

A cleaning method for cleaning a trench according to a preferred embodiment of the present invention will be described in detail below.

Figure 2:
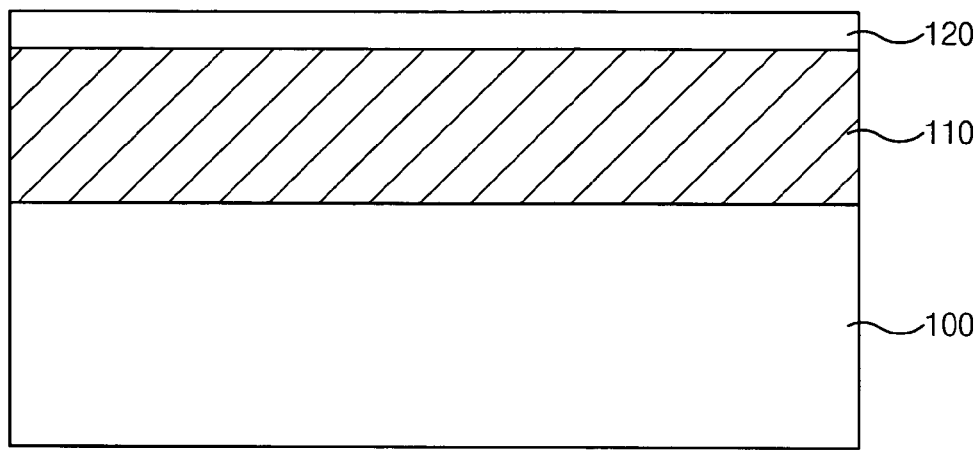
FIGS. 2 to 6 are cross-sectional views showing one embodiment of a method of forming an isolation pattern using a cleaning method of the present invention.

Referring to FIG. 2, a silicon substrate on which a silicon germanium layer and a strained silicon layer are subsequently integrated is formed (step S110).

A silicon germanium layer 110 is formed by growing silicon germanium at the surface portion of a silicon substrate 100 by means of an epitaxial growth method. The epitaxial growth method can be implemented by using a chemical vapor deposition (APCVD) method, a low pressure chemical vapor deposition (LPCVD) method, a molecular beam epitaxy (MBE) method or a ultra high vacuum chemical vapor deposition (UHV CVD) method. The processing temperature and pressure condition are dependent on the deposition method. The silicon germanium layer 110 has a germanium concentration of from about 10 to about 90 percent and prevents the migration of electrons to the lower portion of the channel region where the electrons migrate from a source/drain region after forming a transistor.

On the silicon germanium layer 110, a strained silicon layer 120 is formed by the epitaxial growth method. Since the strained silicon layer 120 is grown on the silicon germanium layer 110 having a relatively high lattice constant, the strained silicon layer 120 has an elongated bonding length when compared with the bonding length of a silicon atom of the silicon substrate 100. That is, the strained silicon layer 120 has a tensile stress.

Figure 3:
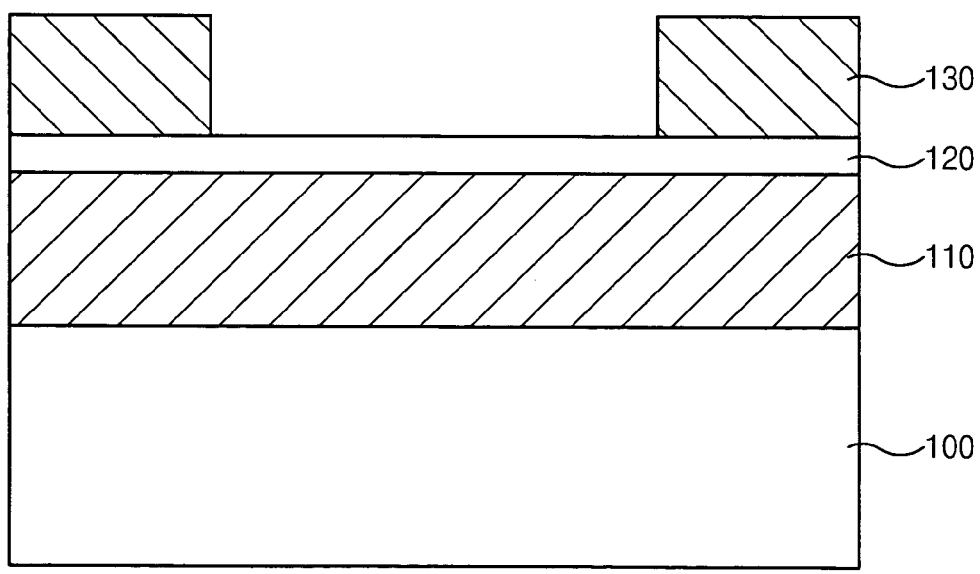
Figure 4:
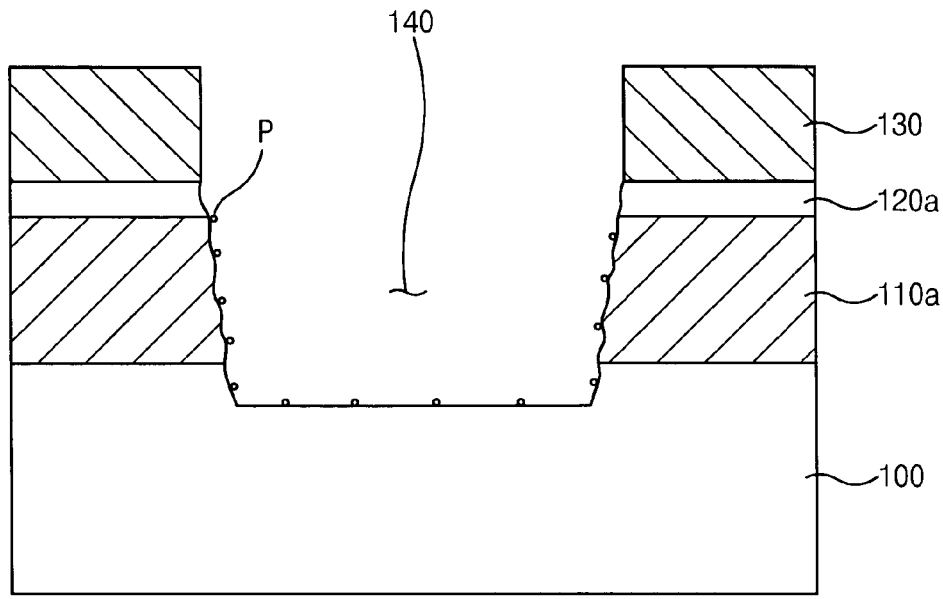

Referring to FIGS. 3 and 4, a hard mask 130 for forming the trench 140 of an STI process on the substrate is formed on the strained silicon layer 120. Then, the exposed portion of the strained silicon layer 120, the silicon germanium layer 110 and the silicon substrate 100 are subsequently dry etched to form the trench 140 for forming an isolation pattern (steps S120 and S130).

Here, an upper portion of the silicon substrate 100 is patterned through the formation of the trench 140, the strained silicon layer 120 gives a silicon pattern 120a, and the silicon germanium layer 110 gives a silicon germanium pattern 110a. During the formation of the trench 140, the surface portion of the silicon germanium pattern 110a is damaged and becomes rough. The inner portion of the trench 140 is contaminated due to particles (P) and requires a cleaning process to remove the particles.

Subsequently, a cleaning solution for cleaning the silicon germanium layer and containing from about 0.01 to about 2.5 percent by weight of a non-ionic surfactant, from about 0.05 to about 5.0 percent by weight of an alkaline compound, and from about 92.5 to about 99.94 percent by weight of pure water is prepared (step S140).

Figure 5:
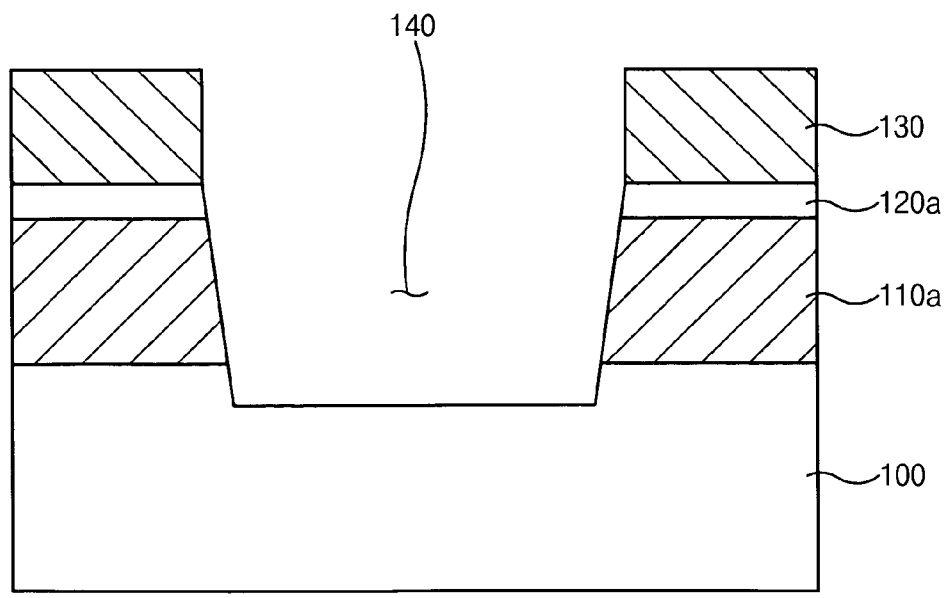

FIG. 5 shows a cleaning process using the cleaning solution for cleaning silicon germanium to remove the contaminating material including the particles (P), without damaging the silicon germanium pattern 110a and to make the surface portion thereof uniform (step S150).

Here, the non-ionic surfactant and the alkaline compound in the cleaning solution remove the particles (P) in the trench, improve the rough surface of the silicon germanium pattern and prevent the damage of the silicon germanium pattern. An explanation on the non-ionic surfactant and the alkaline compound will be omitted to avoid repetition.

The cleaning process of the semiconductor device using the cleaning solution can be implemented by applying a spin spray method, a spin method, a dipping method, a spin method using ultrasonic wave or a dipping method using ultrasonic wave.

Thereafter, the substrate is rinsed using pure water to remove the cleaning solution remaining on the substrate after performing the cleaning process and is then dried (step S160).

Figure 6:
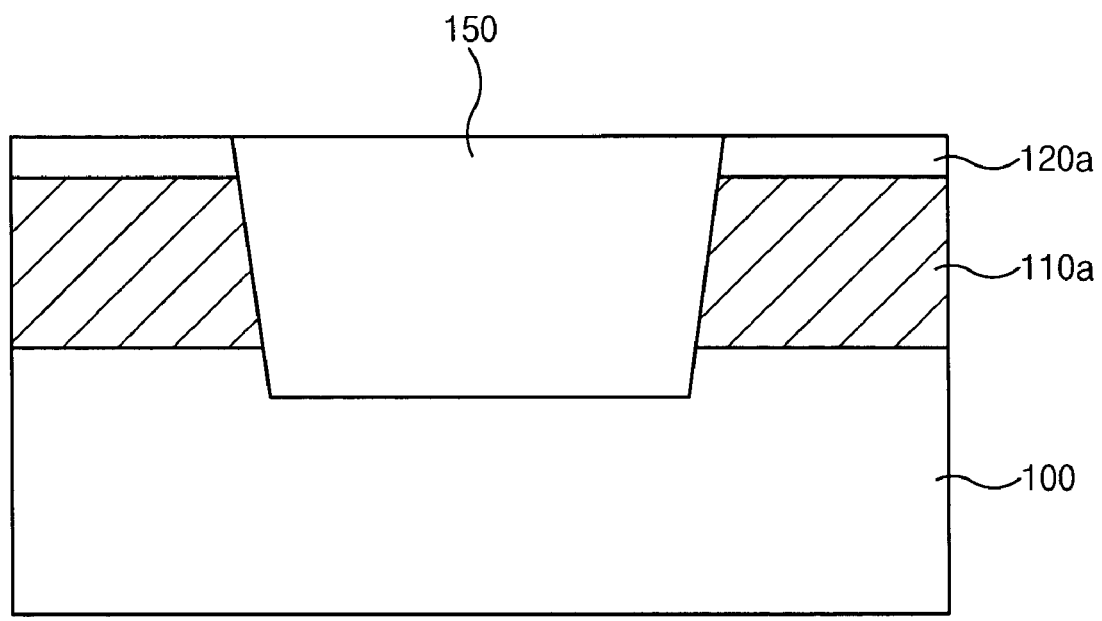

Referring to FIG. 6, the hard mask 130 is removed and an insulating layer pattern 150 for burying the trench 140 of the substrate is formed to obtain an isolation pattern 150 defining an active region.

In accordance with another aspect of the present invention, a cleaning solution for cleaning the silicon germanium layer may prevent damage of the silicon germanium layer and greatly reduce corrosion of a metal pattern.

The cleaning solution according to another embodiment of the present invention includes a non-ionic surfactant, an alkaline compound and pure water as described above for the preparation of the cleaning solution according to the first embodiment of the present invention, and further includes a metal corrosion inhibitor.

That is, the cleaning solution includes from about 0.01 to about 2.5 percent by weight of a non-ionic surfactant, from about 0.01 to about 2.5 percent by weight of a metal corrosion inhibitor, from about 0.05 to about 5 percent by weight of an alkaline compound, and from about 90 to about 99.93 percent by weight of pure water with respect to the cleaning solution.

The metal corrosion inhibitor in the cleaning solution is applied to a process for forming a metal pattern and a silicon germanium pattern to prevent the corrosion of the metal pattern and the corrosion of the silicon germanium pattern. The preferred metal corrosion inhibitor is a compound including a triple bond and at least one hydroxyl functional group. For example, the metal corrosion inhibitor includes 2-butyne-1, 4-diol, 3-butyne-1-ol and a thiol-based compound including 2-mercaptoethanol and 1-mercapto-2,3-propandiol.

When the amount of the metal corrosion inhibitor is less than about 0.01 percent by weight, the corrosion preventing efficiency is low and when the amount of the metal corrosion inhibitor exceeds about 2.5 percent by weight, the corrosion preventing efficiency does not improve further but levels asymptotically. Therefore, the preferred amount of the metal corrosion inhibitor is in the range of from about 0.01 to about 2.5 percent by weight and more preferred amount is in the range of from about 0.05 to about 1 percent by weight.

Hereinafter, a cleaning method of a semiconductor device using the cleaning solution according to the present invention and a method of manufacturing an MIS capacitor employing the method will be described.

FIGS. 7 to 12 are cross-sectional views for illustrating a method of manufacturing an MIS capacitor using a cleaning method according to the present invention.

Figure 7:
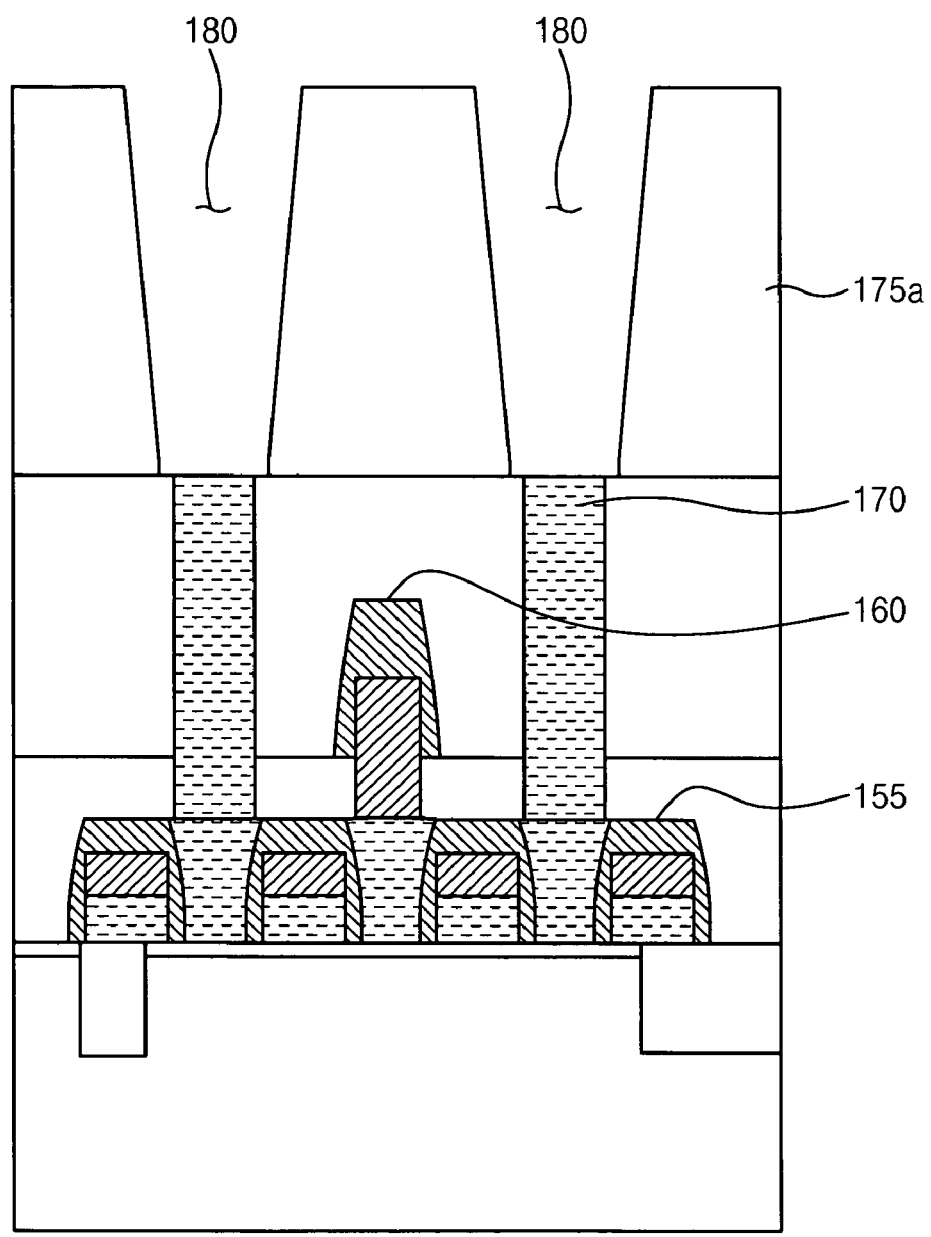
FIGS. 7 to 12 are cross-sectional views showing one embodiment of a method of forming an MIS capacitor using a cleaning method of the present invention.

Referring to FIG. 7, an insulating layer (not shown) is formed on a semiconductor substrate including a transistor 155, a bit line 160 and a contact plug 170 and then is patterned to form an opening portion 180 for exposing an upper portion of the contact plug 170. After completing the forming of the opening portion 180, an insulating pattern 175a is formed from the insulating layer.

Figure 8:
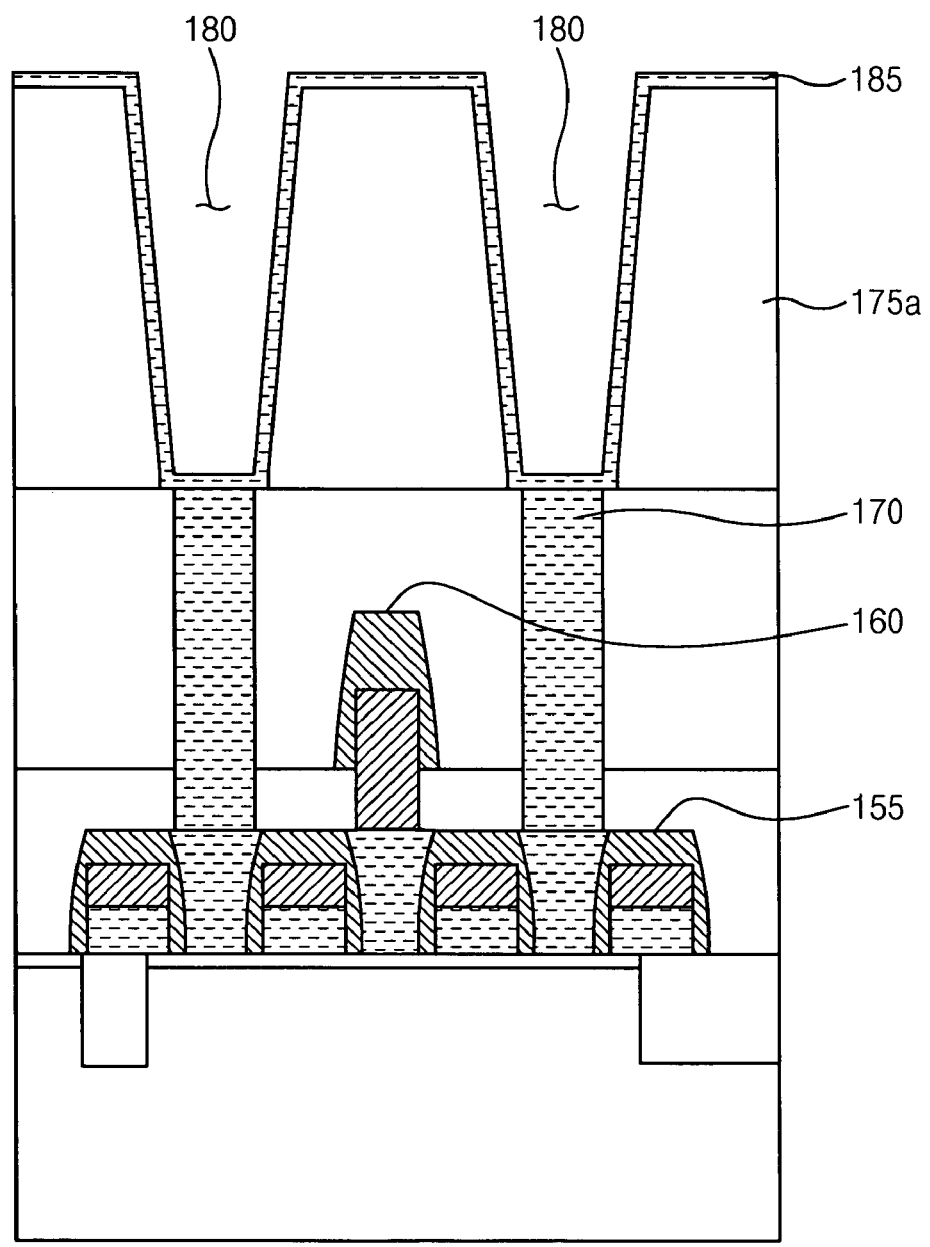

Referring to FIG. 8, a metal layer in the lower electrode 185 having a uniform thickness is formed on the insulating pattern 175a including the opening portion 180. The metal layer 185 is continuously formed on the upper portion of the insulating pattern 175a, and at the side portion and bottom portion of the opening portion 180.

Figure 9:
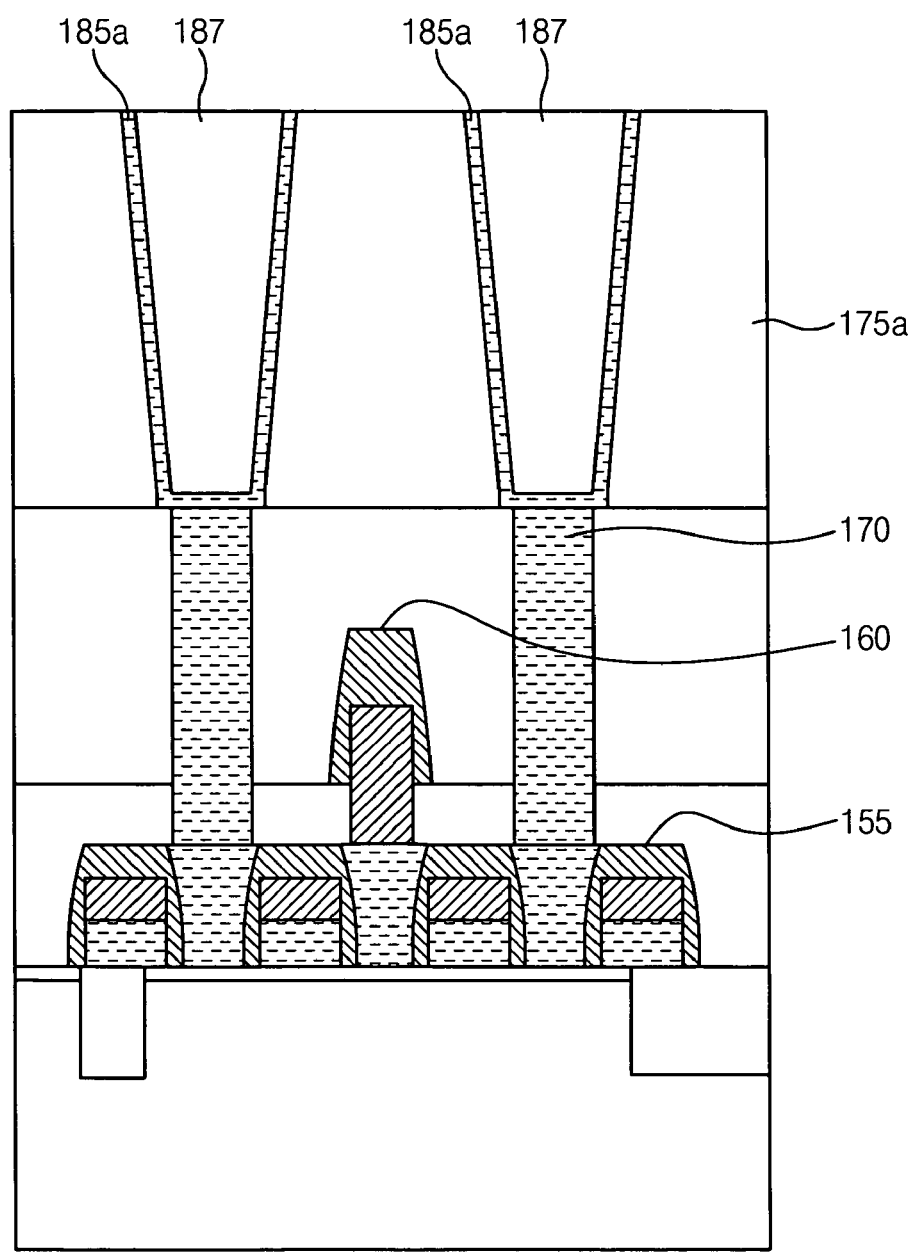

Referring to FIG. 9, an oxide compound is deposited to bury the opening portion 180 on which the metal layer 185 is formed, and then a planarization process is carried out to expose the upper portion of the insulating pattern 175a. The planarization is accomplished by using a chemical mechanical polishing (CMP) process, and the metal pattern is separated through the planarization process to form a lower electrode 185a of an MIS capacitor.

Figure 10:
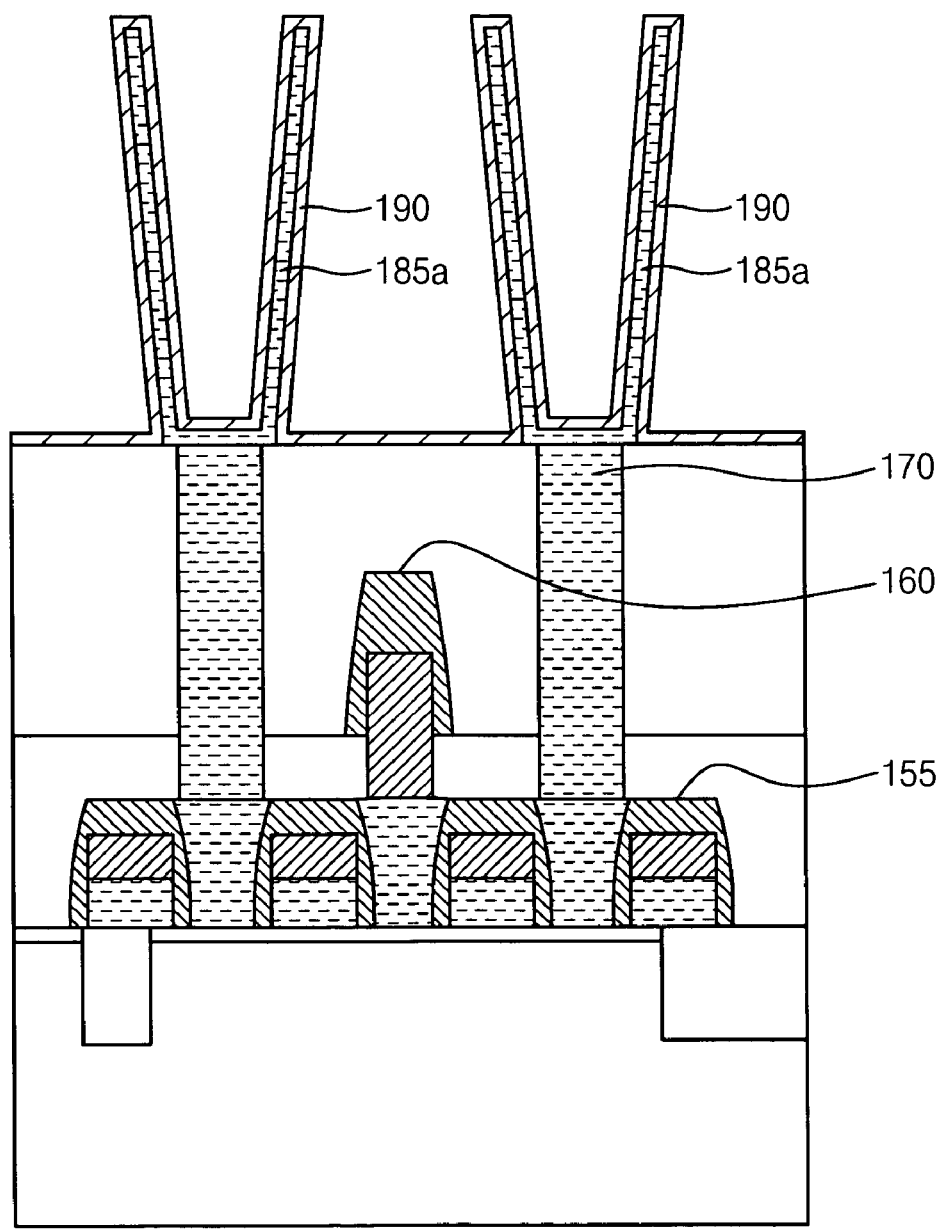

Referring to FIG. 10, the insulating pattern 175a and the oxide positioned in the opening portion 180 are wet etched to remove and to expose the metal pattern 185a corresponding to the lower electrode. The metal pattern 185a corresponding to the lower electrode is formed on the substrate, a dielectric layer 190 having a uniform thickness is continuously formed.

Figure 11:
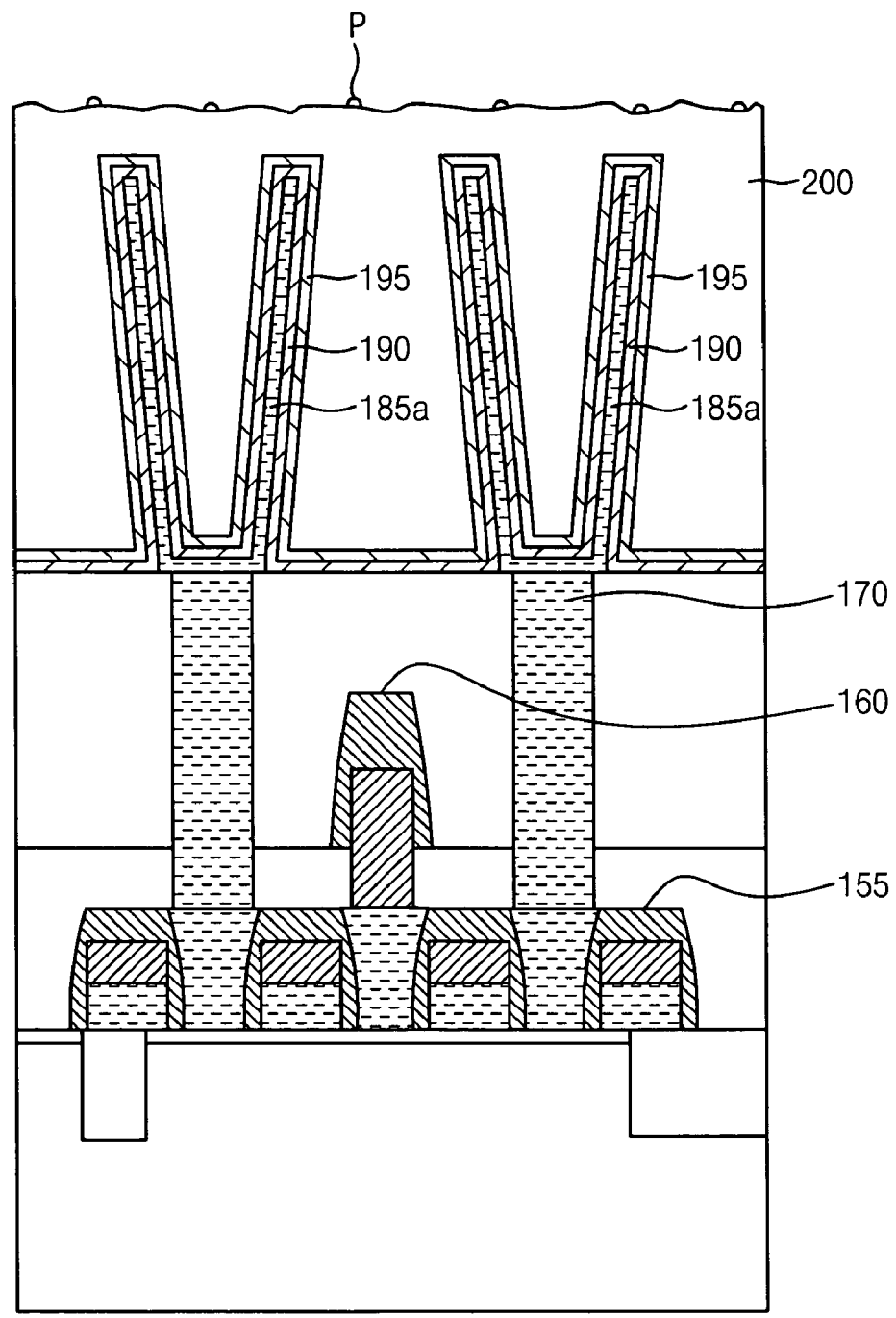
Figure 13:
FIG. 13 is an SEM picture illustrating the surface portion of a silicon germanium layer of an MIS capacitor, prior to performing a cleaning step.

Referring to FIG. 11, a titanium nitride layer 195 and a silicon germanium layer 200 are formed on the dielectric layer 190 to complete a capacitor having an MIS structure. FIG. 13 is an SEM picture illustrating the surface portion of a silicon germanium layer of an MIS capacitor, prior to performing a cleaning step. During forming the MIS capacitor, contaminated materials including germanium oxide and small particle (P) are generated as illustrated in SEM picture of a silicon germanium layer in FIG. 13, and a cleaning process to remove the contaminating materials should be performed.

A cleaning solution of a silicon germanium layer including from about 0.01 to about 2.5 percent by weight of a non-ionic surfactant, from about 0.01 to about 2.5 percent by weight of a metal corrosion inhibitor, from about 0.05 to about 5 percents by weight of an alkaline compound, and from about 90 to about 99.93 percent by weight of pure water is prepared.

Figure 12:
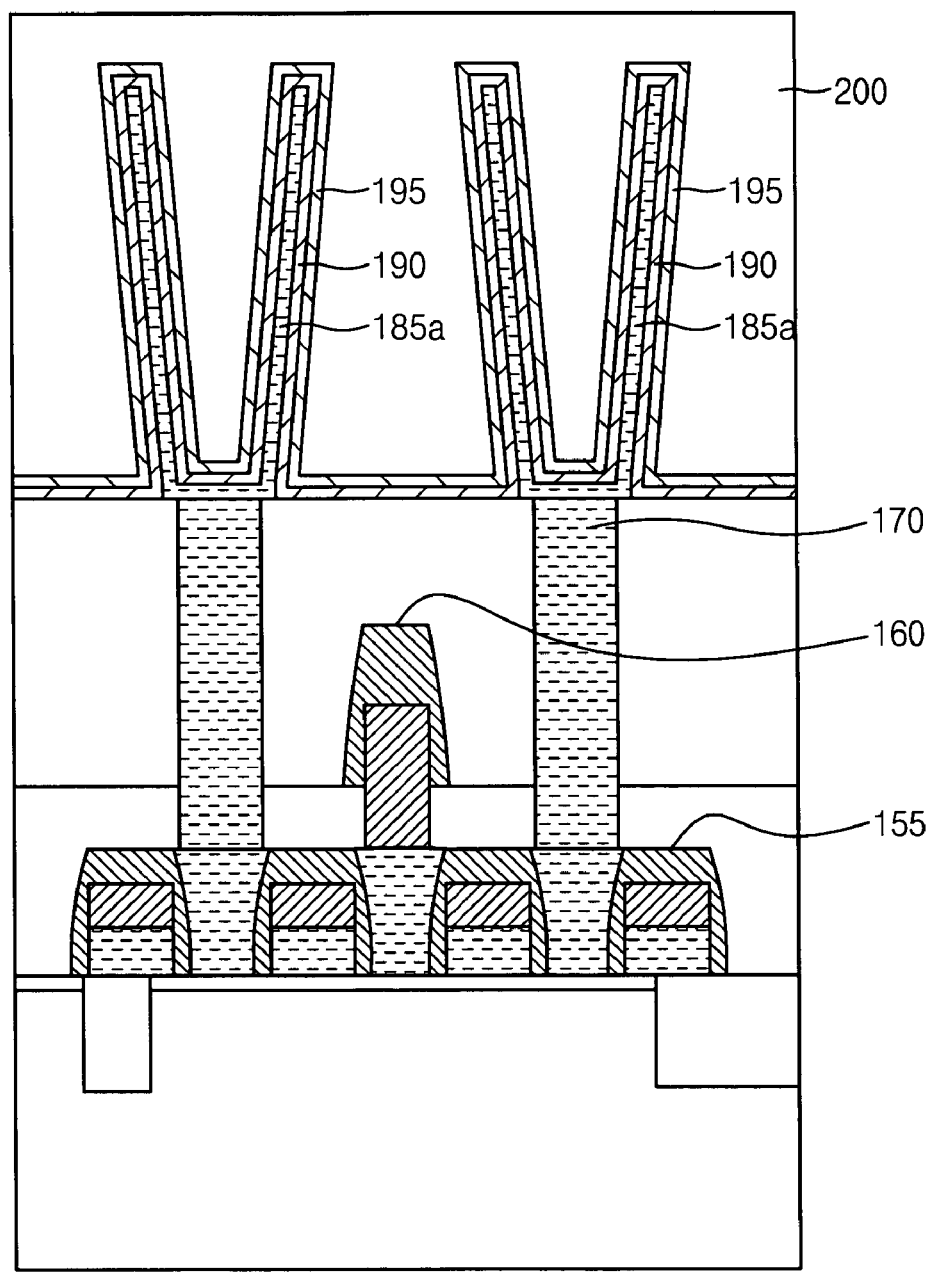

Referring to FIG. 12, the surface portion of the silicon germanium layer 200 of the upper electrode is slightly etched using the cleaning solution of the present invention to improve the rough surface of the silicon germanium layer and to remove the contaminated material, including the particles (P).

Here, the non-ionic surfactant and the alkaline compound in the cleaning solution for removing the particles (P) in the trench and for improving the rough surface state of the silicon germanium pattern, may not damage the silicon germanium pattern. The metal corrosion inhibitor in the cleaning solution prevents the corrosion of the metal pattern due to the cleaning solution, when the metal pattern corresponding to the lower electrode is exposed due to a void.

An explanation on the non-ionic surfactant, the metal corrosion inhibitor and the alkaline compound will be omitted to avoid the repetition.

The cleaning process using the cleaning solution for the silicon germanium layer can be applied by using a method selected from a spin spray method, a spin method, a dipping method, a spin method using ultrasonic wave and a dipping method using ultrasonic wave.

Here, the substrate is rinsed using pure water to remove the cleaning solution remaining on the substrate after completing the cleaning process and then is dried to form an MIS capacitor including an upper electrode having an improved surface portion.

The embodiment of the present invention will be further explained through examples and a comparative example. The examples are to illustrate the invention but the present invention is not limited by the examples.

EXAMPLE 1

Into an aqueous ammonium solution including 99.6 parts by weight of pure water and 0.3 parts by weight of ammonium hydroxide, 0.1 parts by weight of a non-ionic surfactant (NCW1002: purchased from Wako chemical Co.) was added. Then, the resulting mixture was stirred at room temperature to prepare a cleaning solution for cleaning a substrate having a germanium layer.

EXAMPLE 2

A cleaning solution was prepared by implementing the same procedure illustrated in Example 1 except that 99.2 parts by weight of pure water, 0.5 parts by weight of ammonium hydroxide and 0.3 parts by weight of the non-ionic surfactant were used.

EXAMPLE 3

A cleaning solution was prepared by implementing the same procedure illustrated in Example 1 except that 98.5 parts by weight of pure water, 1.0 parts by weight of potassium hydroxide and 0.5 parts by weight of the non-ionic surfactant were used.

EXAMPLE 4

Into an aqueous ammonium solution including 99.5 parts by weight of pure water and 0.3 parts by weight of ammonium hydroxide, 0.1 parts by weight of a non-ionic surfactant (NCW1002: trade name manufactured by Wako Pure Chemical Industries Ltd., Japan) and 0.1 parts by weight of a metal corrosion inhibitor (2-mercaptoethanol) were added. Then, the resulting mixture was stirred at room temperature to prepare a cleaning solution for cleaning a substrate having a metal pattern and a germanium layer.

EXAMPLE 5

A cleaning solution was prepared by implementing the same procedure illustrated in example 4 except that 98.9 parts by weight of pure water, 0.5 parts by weight of potassium hydroxide, 0.3 parts by weight of the non-ionic surfactant and 0.3 parts by weight of the metal corrosion inhibitor were used.

EXAMPLE 6

A cleaning solution was prepared by implementing the same procedure illustrated in example 4 except that 98.0 parts by weight of pure water, 1.0 parts by weight of potassium hydroxide, 0.5 parts by weight of the non-ionic surfactant and 0.5 parts by weight of the metal corrosion inhibitor were used.

COMPARATIVE EXAMPLE

Into 80 parts by weight of pure water, 4 parts by weight of ammonium hydroxide and 16 parts by weight of hydrogen peroxide ($H_2O_2$) were added and the resulting mixture was stirred at room temperature to prepare SC1 cleaning solution.

Experiments 1-3

Measurement on the Degree of Damage to the Silicon Germanium Layer and Cleaning Power Three silicon substrates on which a silicon germanium layer having a thickness of about 1500 Å and a silicon layer having a thickness of about 200 Å were prepared. A trench for forming an isolation pattern was formed on each silicon substrate. Then, each substrate having a trench was cleaned for 5 minutes using the cleaning solution (65° C.) prepared by Examples 1-3 and the degree of damage to the silicon germanium layer and the cleaning power of germanium oxide were observed, respectively. The particles in the trench were removed without damaging the silicon germanium layer.

Experiments 4-6

Measurement on Degree of Damage to the Silicon Germanium Layer and Cleaning Power On a dielectric layer formed on a lower electrode, an upper electrode having a thickness of about 1700 Å of a titanium nitride (TiN) layer/a silicon germanium (SiGe) layer was formed to manufacture an MIS capacitor. Three substrates including the MIS capacitor were cleaned using the cleaning solutions (65° C.) prepared from Examples 4-6 for 5 minutes. Then, the amount of damages to the silicon germanium layer and the cleaning power of germanium oxide were observed. Germanium oxide on the surface of the silicon germanium layer was effectively removed without damaging the silicon germanium layer and no corrosion was observed from the lower metal.

Figure 14:
FIG. 14 is an SEM picture illustrating the surface portion of a silicon germanium layer obtained after performing a cleaning method using a cleaning solution as described in Examples 4 to 6 of the present invention.

FIG. 14 is an SEM picture illustrating the surface portion of a silicon germanium layer obtained after performing a cleaning method using a cleaning solution as described in Examples 4 to 6. FIG. 14 confirms that germanium oxide present on the surface of the silicon germanium layer can be effectively removed by using the cleaning solution including the non-ionic surfactant, the alkaline compound and the metal corrosion inhibitor, without damaging the silicon germanium layer.

COMPARATIVE EXPERIMENT

Figure 15:
FIG. 15 is an SEM picture illustrating the surface portion of a silicon germanium layer obtained after performing a cleaning method using a cleaning solution as in the Comparative Example.

Measurement on Degrees of Damage to the Silicon Germanium Layer and Cleaning Power On a dielectric layer formed on a lower electrode, an upper electrode having a thickness of about 1700 Å of a titanium nitride (TiN) layer/a silicon germanium (SiGe) layer was formed to manufacture an MIS capacitor. A substrate including the MIS capacitor was cleaned using the cleaning solution (65° C.) prepared from the comparative example for 5 minutes. Then, the amount of damage to the silicon germanium layer and the cleaning power of germanium oxide were observed. FIG. 15 is an SEM picture illustrating the surface portion of a silicon germanium layer obtained after performing a cleaning method using a cleaning solution as in Comparative Example.

When the surface of the silicon germanium layer is cleaned using the SC1 cleaning solution, the silicon germanium layer is not uniformly etched, as illustrated in the SEM picture of FIG. 15. The etching degree is also severe and so the present cleaning solution is not appropriate for cleaning silicon germanium.

When using a cleaning solution according to the present invention, germanium oxide on the surface of a silicon germanium layer formed on a semiconductor substrate can be removed without damaging the silicon germanium layer. Subsequently, the rough surface of the silicon germanium layer can be improved and the particles on the semiconductor substrate can be removed. Corrosion of the metal pattern can be prevented and an over-etching of the silicon germanium layer can be restrained during the cleaning of the semiconductor device including exposed metal pattern and silicon germanium layer.

Semiconductor devices having a high reliability can be manufactured and as a result, the time and cost required for the whole process for manufacturing the semiconductor devices can be reduced by using a cleaning solution of the present invention. In addition, the present invention can be used to manufacture the next generation of highly integrated semiconductor devices.

Having thus described exemplary embodiments of the present invention, it can be understood that the invention defined by the appended claims is not to be limited by particular details set forth in the above description as many apparent variations thereof are possible without departing from the spirit or scope thereof as hereinafter claimed.

What is claimed is:

1. A method for cleaning a semiconductor device comprising:
    preparing a cleaning solution comprising from about 0.01 to about 2.5 percent by weight of a non-ionic surfactant, from about 0.05 to about 5.0 percent by weight of an alkaline compound, from about 0.01 to about 2.5 percent by weight of a metal corrosion inhibitor and from about 90 to about 99.9 percent by weight of pure water with respect to the cleaning solution; and
    cleaning an MIS (Metal-Insulator-poly Silicon) capacitor in which an upper electrode of the MIS capacitor comprises a silicon germanium layer using the cleaning solution, while preventing damage to the silicon germanium layer and removing impurities present at a surface portion of the silicon germanium layer.

2. The method as claimed in claim 1, wherein the upper electrode further comprises a titanium nitride layer and a silicon nitride layer.

3. The method as claimed in claim 1, further comprising forming a metal layer in a lower electrode of the capacitor.

4. The method as claimed in claim 1, wherein the non-ionic surfactant comprises at least one compound selected from the group consisting of polyoxyethylene alkyl ether, polyoxyethylene nonyl phenylether, polyoxyethylene lauryl ether, polyoxyethylene tridecyl ether, polyoxyethylene oleyl ether, polyoxyethylene stearyl ether and polyoxyethylene lauryl amine.

5. The method as claimed in claim 1, wherein the alkaline compound comprises at least one compound selected from the group consisting of animonium hydroxide, potassium hydroxide and tetramethyl ammonium hydroxide.

6. The method as claimed in claim 1, wherein the metal corrosion inhibitor comprises at least one compound selected from the group consisting of 2-butyne-1,4-diol, 3-butyne-1-ol, 2-mercaptoethanol and 1-mercapto-2,3-propandiol.

* * * * *